(12) United States Patent
Asada et al.

(10) Patent No.: US 12,514,031 B2
(45) Date of Patent: Dec. 30, 2025

(54) LIGHT EMITTING ELEMENT AND METHOD OF MANUFACTURING SAME

(71) Applicant: NICHIA CORPORATION, Anan (JP)

(72) Inventors: Koji Asada, Tokushima (JP); Takuya Okada, Anan (JP)

(73) Assignee: NICHIA CORPORATION, Anan (JP)

( * ) Notice: Subject to any disclaimer, the term of this patent is extended or adjusted under 35 U.S.C. 154(b) by 500 days.

(21) Appl. No.: 18/156,240

(22) Filed: Jan. 18, 2023

(65) Prior Publication Data
US 2023/0231079 A1 Jul. 20, 2023

(30) Foreign Application Priority Data

Jan. 19, 2022 (JP) .................................. 2022-006580
Sep. 15, 2022 (JP) .................................. 2022-147283

(51) Int. Cl.
| | |
|---|---|
| *H10H 20/811* | (2025.01) |
| *H10H 20/01* | (2025.01) |
| *H10H 20/81* | (2025.01) |
| *H10H 20/819* | (2025.01) |
| *H10H 20/825* | (2025.01) |

(Continued)

(52) U.S. Cl.
CPC .... *H10H 20/8312* (2025.01); *H10H 20/0137* (2025.01); *H10H 20/8215* (2025.01); *H10H 20/825* (2025.01); *H10H 20/857* (2025.01); *H10H 20/032* (2025.01); *H10H 20/0364* (2025.01)

(58) Field of Classification Search
CPC .... H10H 20/81; H10H 20/811; H10H 20/819; H10H 20/82; H10H 20/821; H10H 20/825; H10H 20/8312; H10H 20/0137; H10H 20/8215; H10H 20/857; H10H 20/032; H10H 20/0364; H10H 20/816; H10H 20/812; H10H 20/042; H10H 20/814
See application file for complete search history.

(56) References Cited

U.S. PATENT DOCUMENTS

| | | | |
|---|---|---|---|
| 6,329,667 B1 | 12/2001 | Ota et al. | |
| 9,159,875 B2 * | 10/2015 | Cheon | ................. H10H 20/819 |
| 9,287,367 B2 * | 3/2016 | Kwak | ................. H10D 62/102 |

(Continued)

FOREIGN PATENT DOCUMENTS

| | | |
|---|---|---|
| EP | 2 843 714 A1 | 3/2015 |
| JP | 2000-232238 A | 8/2000 |

(Continued)

*Primary Examiner* — Eduardo A Rodela
(74) *Attorney, Agent, or Firm* — Foley & Lardner LLP

(57) ABSTRACT

A light emitting element comprises a semiconductor structure which includes an n-side layer, a p-side layer, and an ultraviolet light emitting active layer positioned between the n-side layer and the p-side layer, each being made of a nitride semiconductor, an n-electrode electrically connected to the n-side layer, and a p-electrode electrically connected to the p-side layer. The active layer has a well layer containing Al, a barrier layer containing Al, and holes defined by the lateral faces of the well layer and the lateral faces of the barrier layer. The p-side layer has a first layer containing Al, a second layer containing Al disposed on the first layer and in contact with the lateral faces of the well layer, and a third layer disposed on the second layer. The third layer is smaller in thickness than the first layer.

21 Claims, 4 Drawing Sheets

(51) Int. Cl.
  *H10H 20/831*  (2025.01)
  *H10H 20/857*  (2025.01)

(56)      References Cited

U.S. PATENT DOCUMENTS

| | | |
|---|---|---|
| 9,972,745 B2 * | 5/2018 | Nagata ................ H10H 20/819 |
| 10,490,695 B2 | 11/2019 | Gomez-Iglesias et al. |
| 11,424,329 B2 * | 8/2022 | Han ..................... H10H 20/821 |
| 2002/0084452 A1 | 7/2002 | Ota et al. |
| 2003/0001161 A1 | 1/2003 | Ota et al. |
| 2012/0032137 A1 * | 2/2012 | Schellhammer ....... H10H 20/01 |
| | | 257/14 |
| 2013/0037779 A1 | 2/2013 | Takeoka et al. |
| 2015/0060762 A1 | 3/2015 | Kim et al. |
| 2015/0115223 A1 | 4/2015 | Kwak et al. |
| 2015/0263232 A1 | 9/2015 | Shioda et al. |
| 2020/0227590 A1 | 7/2020 | Pernot et al. |
| 2020/0243716 A1 | 7/2020 | Bergbauer et al. |

FOREIGN PATENT DOCUMENTS

| | | |
|---|---|---|
| JP | 2002-368269 A | 12/2002 |
| JP | 2017-028076 A | 2/2017 |
| JP | 2018-037539 A | 3/2018 |
| JP | 2019-501529 A | 1/2019 |
| JP | 2019-054122 A | 4/2019 |
| JP | 2019-054247 A | 4/2019 |
| WO | WO-2018/012585 A1 | 1/2018 |

* cited by examiner

LIGHT EMITTING ELEMENT AND METHOD OF MANUFACTURING SAME

CROSS-REFERENCE TO RELATED APPLICATION

This application claims priority to Japanese Patent Application No. 2022-006580, filed on Jan. 19, 2022, and Japanese Patent Application No. 2022-147283, filed on Sep. 15, 2022, the disclosures of which are hereby incorporated by reference in their entireties.

BACKGROUND

The present invention relates to a light emitting element and a method of manufacturing the light emitting element.

Japanese Patent Publication No. 2019-54122 describes a deep ultraviolet light emitting element comprising a plurality of nitride semiconductor layers. There is a need to improve the light extraction efficiency of such a light emitting element.

An object of an embodiment of the present invention is to provide a high light extraction efficiency light emitting element and a method of manufacturing the light emitting element.

A light emitting element according to one embodiment of the present invention comprises: a semiconductor structure comprising an n-side layer, a p-side layer, and an active layer configured to emit ultraviolet light positioned between the n-side layer and the p-side layer, each being made of a nitride semiconductor; an n-electrode electrically connected to the n-side layer; and a p-electrode electrically connected to the p-side layer. The active layer comprises a well layer containing Al, a barrier layer containing Al, and holes defined by lateral faces of the well layer and lateral faces of the barrier layer. The p-side layer comprises a first layer containing Al, a second layer containing Al disposed on the first layer and in contact with the lateral faces of the well layer, and a third layer disposed on the second layer. A thickness of the third layer is less than a thickness of the first layer. An Al composition ratio of the second layer differs from an Al composition ratio of the well layer by 10% or less. An Al composition ratio of the third layer is less than an Al composition ratio of the second layer, or the third layer contains no Al. The p-electrode is disposed on the third layer.

A method of manufacturing a light emitting element according to one embodiment of the present invention comprises forming an n-side layer made of a nitride semiconductor; forming, on the n-side layer, an active layer configured to emit ultraviolet light and comprising a well layer containing Al and a barrier layer containing Al, each being made of a nitride semiconductor, and holes defined by lateral faces of the well layer and lateral faces of the barrier layer; forming, on the active layer, a p-side layer comprising a first layer containing Al, a second layer containing Al, and a third layer, each being made of a nitride semiconductor, wherein an Al composition ratio of the second layer differs from an Al composition ratio of the well layer by 10% or less, wherein a thickness of the third layer is less than a thickness of the first layer, wherein an Al composition ratio of the third layer is less than an Al composition ratio of the second layer, or the third layer contains no Al, and wherein the step of forming the p-side layer comprises: forming the first layer on the active layer, forming the second layer on the first layer and in contact with the lateral faces of the well layer, and forming the third layer on the second layer; forming an n-electrode electrically connected to the n-side layer; and forming a p-electrode electrically connected to the third layer of the p-side layer.

According to certain embodiments of the present invention, a high light extraction efficiency light emitting element and a method of manufacturing the light emitting element can be provided.

DETAILED DESCRIPTION

Figure 1:
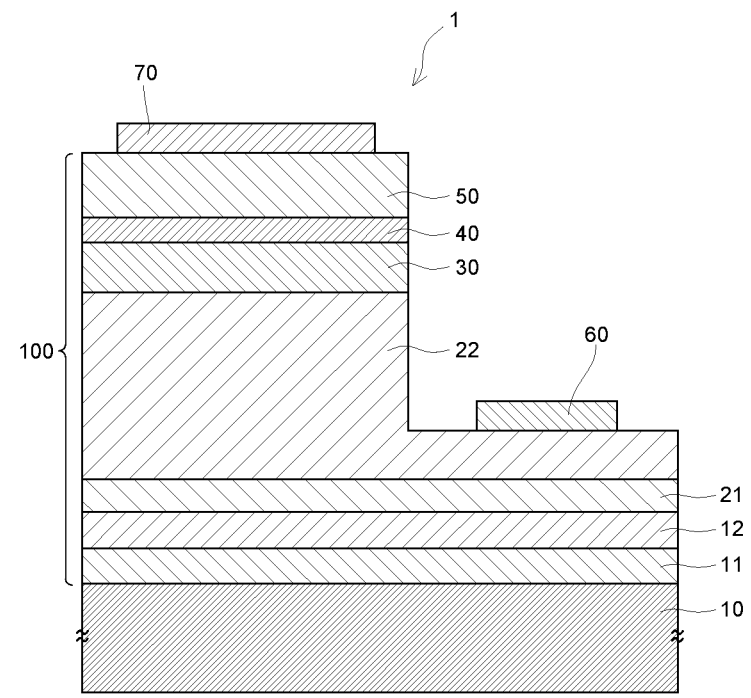
FIG. 1 is a schematic cross-sectional view showing the constituents of a light emitting element according to an embodiment of the present invention.

Certain embodiments of the present invention will be explained below. The drawings referenced in the following description are schematic representations of the present invention. Therefore, the scale, spacing, or positional relationships of members might be exaggerated, or a certain portion of a member omitted. In the description below, the same reference numerals are used to denote the same members or those of similar quality for which detailed explanation might be omitted as appropriate.

Figure 2:
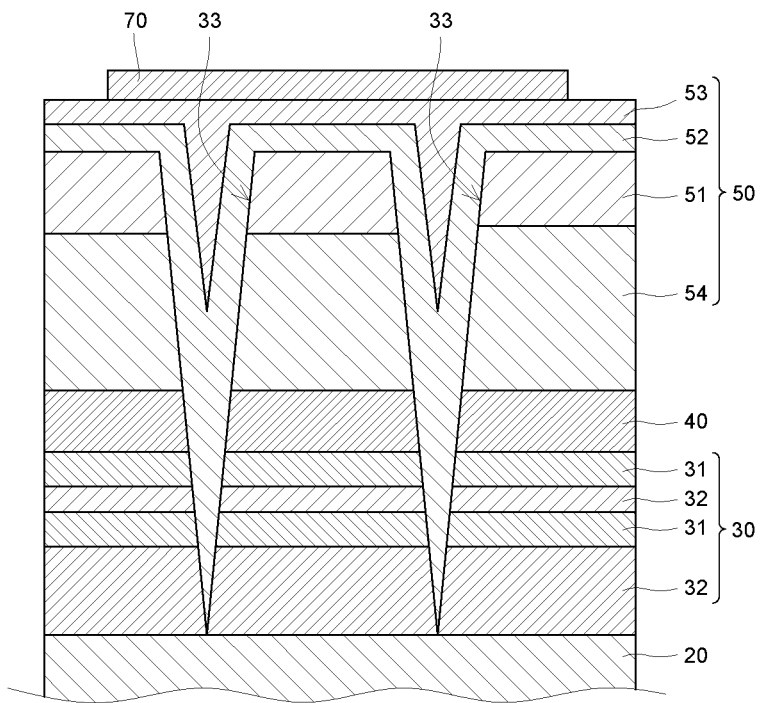
FIG. 2 is a schematic cross-sectional view showing the constituents of the light emitting element of the embodiment of the present invention.

FIG. 1 is a schematic cross-sectional view of a light emitting element 1. FIG. 2 is a schematic cross-sectional view enlarging a portion of a semiconductor structure 100. As shown in FIGS. 1 and 2, the light emitting element 1 has a substrate 10 and a semiconductor structure 100 disposed on the substrate 10. The semiconductor structure 100 includes an n-side layer 20, a p-side layer 50, and an ultraviolet light emitting active layer 30 positioned between the n-side layer and the p-side layer, each being made of a nitride semiconductor. The semiconductor structure 100 further includes a buffer layer 11 and a superlattice layer 12 positioned between the substrate 10 and the n-side layer 20, and an electron blocking layer 40 positioned between the active layer 30 and the p-side layer 50. The light emitting element 1 has an n-electrode 60 electrically connected to the n-side layer 20 and a p-electrode 70 electrically connected to the p-side layer 50.

For the material of the substrate 10, for example, sapphire, silicon (Si), gallium nitride (GaN), aluminum nitride (AlN), or the like can be used. A substrate 10 made of sapphire is preferable as it has a high transmittance with respect to the ultraviolet light from the active layer 30. The semiconductor structure 100 can be disposed, for example, on C-plane of the sapphire substrate, and is preferably disposed on a face oblique to the C-plane of the sapphire substrate forming a 0.2 to 2 degree angle with the a-axis or the m-axis of the sapphire substrate. The thickness of the substrate 10 can be set, for example, in a range of 150 μm to 800 μm. The light emitting element 1 does not have to have a substrate 10.

The semiconductor structure 100 is a stack structure in which nitride semiconductor layers are stacked. Nitride semiconductors can include all semiconductors obtained by varying the composition ratio x and y within their ranges in the chemical formula $In_xAl_yGa_{1-x-y}N$ (0≤x≤1, 0≤y≤1, x+y≤1).

For the buffer layer 11, for example, an AlN layer can be used. The buffer layer 11 has the function of reducing the lattice mismatch between the substrate 10 and the nitride semiconductor layers disposed on the buffer layer 11. The thickness of the buffer layer 11 can be set, for example, in a range of 0.5 μm to 4 μm, more preferably 1.5 μm to 4 μm. In the present specification, the thickness of each semiconductor layer refers to the thickness in the stacking direction of the semiconductor structure 100.

A superlattice layer 12 has a multilayer structure in which first semiconductor layers and second semiconductor layers having a different lattice constant from that of the first semiconductor layers are alternately formed. The superlattice layer 12 has the function of reducing the stress occurring in the semiconductor layers disposed above the superlattice layer 12. The superlattice layer 12 can be a multilayer structure in which AlN layers and aluminum gallium nitride (AlGaN) layers are alternately stacked, for example. The number of pairs of first and second semiconductor layers in the superlattice layer 12 can be set in a range of 20 to 50 pairs. In the case in which the first semiconductor layers are AlGaN layers and the second semiconductor layers are AlN layers, the first semiconductor layers and the second semiconductor layers can each be in a range of 5 nm to 30 nm in thickness.

The n-side layer 20 includes one or more n-type semiconductor layers. Examples of n-type semiconductor layers include semiconductor layers containing an n-type impurity, such as silicon (Si), germanium (Ge), or the like. An n-type semiconductor layer is, for example, an AlGaN layer containing aluminum (Al), gallium (Ga), and nitrogen (N), and may contain indium (In). For example, the n-type impurity concentration of an n-type semiconductor layer containing Si as an n-type impurity is in a range of $5×10^{18}$ cm$^3$ to $1×10^{20}$ cm$^3$. The n-side layer 20 has only to have the function of supplying electrons, and may include an undoped layer. Here, an undoped layer is a layer not intentionally doped with an n-type impurity or a p-type impurity. In the case where an undoped layer is adjacent to a layer intentionally doped with an n-type impurity and/or a p-type impurity, the undoped layer might contain the n-type impurity and/or the p-type impurity diffused from the adjacent layer.

As shown in FIG. 1, the n-side layer 20 includes an underlayer 21 and an n-contact layer 22. The underlayer 21 is disposed between the superlattice layer 12 and the n-contact layer 22. The n-contact layer 22 is disposed between the underlayer 21 and the active layer 30.

For an underlayer 21, for example, an undoped AlGaN layer can be used. In the case in which the underlayer 21 is an AlGaN layer, the Al composition ratio of the AlGaN layer can be set, for example, in a range of 50% or higher.

For an n-contact layer 22, for example, an AlGaN layer containing an n-type impurity can be used. In the case of using an AlGaN layer as the n-contact layer, the Al composition ratio of the AlGaN layer can be set, for example, in a range of 50% or higher. In the present specification, an AlGaN layer having an Al composition ratio of 50%, for example, means that the composition ratio x in the chemical formula $Al_xGa_{1-x}N$ is 0.5. The n-type impurity concentration of the n-contact layer 22 can be set, for example, in a range of $5×10^{18}$ cm$^3$ to $1×10^{20}$ cm$^3$. The n-contact layer 22 is larger in thickness than the underlayer 21. The thickness of the n-contact layer 22 can be set, for example, in a range of 1.5 μm to 4 μm. The n-contact layer 22 has an upper face on which no semiconductor layer is disposed. An n-electrode 60 is disposed on the upper face of the n-contact layer 22 on which no semiconductor layer is disposed.

The active layer 30 is disposed between an n-side layer 20 and a p-side layer 50. The active layer 30 emits ultraviolet light. The peak emission wavelength of the ultraviolet light emitted by the active layer 30 is, for example, 220 nm to 350 nm.

The active layer 30 has a well layer 31 containing Al, a barrier layer 32 containing Al, and holes defined by the lateral faces of the well layer 31 and the lateral faces of the barrier layer 32. The holes of the active layer 30 are, for example, V pits created during the formation of the active layer 30. The holes of the active layer 30 may be, for example, through holes that go through the active layer 30, or those having bottoms in the barrier layer 32. The active layer 30 has, for example, a multiple quantum well structure that includes a plurality of well layers 31 and a plurality of barrier layers 32. The Al composition ratio of a barrier layer 32 is higher than the Al composition ratio of a well layer 31. In other words, the band gap energy of a barrier layer 32 is larger than the band gap energy of a well layer 31. A well layer 31 containing Al emits light having the emission wavelength corresponding to the band gap energy of the well layer 31. The active layer 30 is not limited to a multiple quantum well structure that includes a plurality of well layers 31, and can be a single quantum well structure. Furthermore, the lowermost layer of the active layer 30 is a barrier layer 32 in FIG. 2, but the lowermost layer of the active layer 30 may be a well layer 31. The uppermost layer of the active layer 30 is a well layer 31 in FIG. 2, but the uppermost layer of the active layer 30 may be a barrier layer 32.

For a well layer 31, for example, an AlGaN layer can be used. For a barrier layer 32, for example, a AlGaN layer can be used. The Al composition ratio of a well layer 31 can be set, for example, in a range of 10% or higher, specifically 10% to 50%, more specifically 30% to 50%. In the case of allowing a well layer 31 to emit light having a peak emission wavelength of about 280 nm, an AlGaN layer having an Al composition ratio of about 42% can be used for the well layer 31. The Al composition ratio of a barrier layer 32 can be set, for example, in a range of 10% or higher, specifically 10% to 60%, more specifically 30% to 60%.

The thickness of a well layer 31 can be set, for example, in a range of 3 nm to 6 nm. The thickness of a barrier layer 32 is in a range of, for example, 2 nm to 4 nm. From the standpoint of increasing the volume of the semiconductor layer that contributes to light emission, the well layer 31 is preferably larger in thickness than the barrier layer 32. The thickness of the well layer 31 can be set as 1.5 to 2 times the thickness of the barrier layer 32. The well layer 31 and the barrier layer 32 may contain an n-type impurity and/or a p-type impurity at least in part.

A V pit 33 is formed continuously across the active layer 30, the electron blocking layer 40 and a portion of the p-side layer 50. In this embodiment, a V pit 33 is defined by the faces that include the lateral faces of the well layer 31, the lateral faces of the barrier layer 32, the lateral faces of the electron blocking layer 40, the lateral faces of the fourth layer 54, and the lateral faces of the first layer 51. A V pit 33 is formed during the formation of the semiconductor structure 100, and a recess is created on the surface of the semiconductor structure 100 corresponding to the part where the V pit 33 is located. The semiconductor structure 100 has a plurality of V pits 33. When viewed from above, the shape of a V pit 33 is, for example, circular, elliptical, or hexagonal. When viewed from above, the diameter of a V pit 33 is in a range of, for example, 30 nm to 100 nm. A V pit 33 is, for example, a cone, elliptical pyramid, or polygonal pyramid in which the diameter increases from the n-side layer 20 side to the p-side layer 50. V pits 33 are formed, for example, when a semiconductor structure 100 is epitaxially grown on a substrate 10.

The electron blocking layer 40 is disposed to reduce the overflow of electrons supplied from the n-side layer 20. The electron blocking layer 40 can be a multilayer structure having a plurality of semiconductor layers containing Al. The electron blocking layer 40 can be a multilayer structure including, for example, an AlN layer, a first AlGaN layer, and a second AlGaN layer successively from the active layer 30 side. The Al composition ratio of the first AlGaN layer is lower than the Al composition ratio of the second AlGaN layer, and higher than the Al composition ratio of the well layer 31. For the electron blocking layer 40, a semiconductor layer having a higher Al composition ratio than the Al composition ratio of the barrier layers is used. This can reduce the electron overflow. For the electron blocking layer 40, for example, an undoped AlGaN layer, undoped AlN layer, or the like can be used. The total thickness of the electron blocking layer 40 can be set, for example, in a range of 5 nm to 15 nm.

In general, in order to reduce the amount of light from the well layer 31 that is absorbed by a semiconductor layer to thereby increase the light extraction efficiency, a semiconductor layer having a high light transmittance with respect to the light from the well layer 31 is preferably used as a p-side layer 50. For example, using as a p-side layer 50 an AlGaN layer having a higher Al composition ratio than the Al composition ratio of the well layer 31 can make it difficult for the p-side layer 50 to absorb the light from the well layer 31. However, an AlGaN layer having a high Al composition ratio has larger band gap energy than a GaN layer or the like. For this reason, using an AlGaN layer having a high Al composition ratio as a p-side layer 50 results in inadequate conversion of the p-side layer 50 into a p-type layer or an increased contact resistance between the p-electrode 70 and the p-side layer 50. This makes it difficult for a light emitting element having a well layer made of AlGaN having a relatively high Al composition ratio to achieve both high light extraction efficiency and low forward voltage Vf. In this embodiment, providing the p-side layer 50 described below can produce a light emitting element 1 that has high emission efficiency and low forward voltage Vf.

The p-side layer 50 includes one or more p-type semiconductor layers. Examples of p-type semiconductor layers include those that contain a p-type impurity, such as magnesium (Mg) or the like. As shown in FIG. 2, the p-side layer 50 has, successively from the active layer 30 side, a first layer 51, a second layer 52, and a third layer 53. The p-side layer 50 further has a fourth layer 54 disposed between the electron blocking layer 40 and the first layer 51. The first layer 51 contains Al. The second layer contains Al and is disposed on the first layer 51 in contact with the lateral faces of the well layer 31. The third layer 53 is disposed on the second layer 52. The fourth layer 54 contains Al.

An Al composition ratio of the second layer differs from an Al composition ratio of the well layer by 10% or less. This allows the light from the lateral faces of the well layer 31 defining a V pit 33 to propagate to the second layer 52 disposed in contact with the lateral faces of the well layer 31, thereby facilitating the extraction of light through the p-side layer 50 while reducing the absorption of light by the second layer 52. This can achieve a high light extraction efficiency light emitting element 1.

A thickness of the third layer 53 is less than a thickness of the first layer 51. The third layer 53, furthermore, has a lower Al composition ratio than the Al composition ratio of the second layer 52, or contains no Al. The p-electrode 70 is disposed on the third layer 53. This can reduce the contact resistance between the p-electrode 70 and the third layer 53 while reducing the absorption of light by the third layer 53. This thus can reduce the forward voltage Vf while reducing the degradation of the light extraction efficiency.

As described above, according to this embodiment, a high light extraction efficiency light emitting element 1 can be achieved. Moreover, the forward voltage Vf of the light emitting element 1 can be reduced.

The second layer 52 is continuously disposed from the upper face of the first layer 51 to the lateral faces of the fourth layer 54, the lateral faces of the electron blocking layer 40, the lateral faces of the well layer 31, and the lateral faces of the barrier layer 32. All of the lateral faces of the semiconductor layers defining the V pits 33 are covered by the second layer 52, and recesses corresponding to the V pits 33 are formed on the surface of the second layer 52. In order to bring the surface condition of the third layer 53 to be disposed on the second layer 52 close to being flat, the depths of the recesses formed at the surface of the second layer 52 are preferably less than the depths of the V pits 33 in a cross section. In this embodiment, as shown in FIG. 2, the upper surface of the second layer 52 is entirely covered by the third layer 53, but is not limited to this. For example, a portion of the upper face of the second layer 52 may be exposed from the third layer 53 to the extent that the contact resistance between the p-electrode 70 and the third layer 53 is not degraded.

The third layer 53 is preferably less in thickness than the second layer 52. For example, the thickness of the third layer 53 located above the first layer 51 is preferably equal to or less in thickness than the second layer 52. This can reduce the absorption of light by the third layer 53. The second layer 52 is preferably less in thickness than the first layer 51. This can reduce the absorption of light by the second layer 52.

The thickness of the first layer 51 can be set, for example, in a range of 20 nm to 40 nm. The thickness of the second layer 52 is preferably set, for example, in a range of 3 nm to 20 nm, more preferably 3 nm to 15 nm. Setting the thickness of the second layer 52 as 3 nm or greater can facilitate the filling of V pits 33. Setting the thickness of the second layer 52 as 20 nm or less can reduce the absorption of light by the second layer 52. The thickness of the third layer 53 is preferably set, for example, in a range of 3 nm to 20 nm, more preferably 3 nm to 15 nm. Setting the thickness of the third layer 53 as 3 nm or greater can increase the effect of reducing the contact resistance between the p-electrode 70 and the third layer 53 more easily. Setting the thickness of the third layer 53 as 20 nm or less can reduce the absorption of light by the third layer 53.

The first layer 51, the second layer 52, and the third layer 53 contain a p-type impurity. The second layer 52 and the third layer 53 preferably have a higher p-type impurity concentration than the p-type impurity concentration of the first layer 51. Allowing the layers in the vicinity of the third layer 53 on which the p-electrode 70 is disposed to have a high p-type impurity concentration can facilitate the supply of holes from the p-side layer 50 to the active layer 30, thereby increasing the emission efficiency of the light emitting element 1.

The p-type impurity concentration of the third layer 53 is preferably higher than the p-type impurity concentration of the second layer 52. Allowing the third layer 53 on which the p-electrode 70 is disposed to have a high p-type impurity concentration can facilitate the supply of holes from the p-side layer 50 to the active layer 30, thereby increasing the emission efficiency of the light emitting element 1. The p-type impurity concentration of the third layer 53 is higher than the p-type impurity concentration of the fourth layer 54.

The p-type impurity concentrations of the first layer 51, the second layer 52, the third layer 53, and the fourth layer 54 are in a range of, for example, $1 \times 10^{19}$ cm$^3$ to $1 \times 10^{21}$ cm$^3$.

The Al composition ratio of the first layer 51 is preferably higher than the Al composition ratio of the second layer 52. The light extraction efficiency can be increased by setting a higher Al composition ratio for the first layer 51, which is positioned closer to the active layer 30 than the second layer 52 is, to reduce the light absorption by the first layer 51.

The first layer 51 may be a composition gradient layer in which the Al composition ratio decreases from the active layer 30 side to the second layer 52 side. This can reduce the portion of the first layer 51 that has a high Al composition ratio to thereby reduce the forward voltage Vf as compared to the case in which the first layer 51 is a semiconductor layer having a constant Al composition ratio. For example, the Al composition ratio difference between the portion of the first layer 51 positioned on the active layer 30 side and the portion of the first layer 51 positioned on the second layer 52 side can be set in a range of 20% to 60%. Specifically, the Al composition ratio of the portion of the composition gradient layer positioned on the active layer 30 side can be set in a range of 40% to 70%, and the Al composition ratio of the portion of the composition gradient layer positioned on the second layer 52 side can be set in a range of 0% to 20%. Furthermore, a portion of the first layer 51 may be a composition gradient layer in which the Al composition ratio decreases. This can reduce the high Al composition ratio portion of the first layer 51 to thereby reduce the forward voltage Vf as compared to the case in which the entire first layer 51 is a composition gradient layer. For example, only the portion of the first layer 51 that is positioned on the second layer 52 side can be a composition gradient layer. The composition gradient portion of the first layer 51 can have a thickness of 3% to 20% of the thickness of the first layer 51. The composition gradient portion of the first layer 51 can have a thickness, for example, in a range of 1 nm to 30 nm.

The Al composition ratio of the second layer 52 is preferably higher than the Al composition ratio of a well layer 31. This can further reduce the amount of light absorbed by the second layer 52 while facilitating the propagation of the light from the lateral faces of the well layer 31 through the second layer 52 thereby increasing the light extraction efficiency.

The Al composition ratio of the first layer 51 is preferably set, for example, in a range of 50% to 70%, more preferably 50% to 60%. The Al composition ratio of the second layer 52 is preferably set, for example, in a range of 30% to 60%, more preferably 35% to 55%, even more preferably 40% to 55%. Setting the Al composition ratio of the second layer 52 to 30% or higher can reduce the amount of light absorbed by the second layer 52. Setting the Al composition ratio of the second layer 52 to 60% or less can reduce the bulk resistance of the second layer 52 to thereby reduce the degradation of the forward voltage Vf. The Al composition ratio of the third layer 53 is preferably set, for example, to 3% or less. This can promote the conversion of the third layer 53 into a p-type layer to further improve the emission efficiency.

The first layer 51 is made of aluminum gallium nitride, for example. The second layer 52 is made of aluminum gallium nitride, for example. The third layer 53 is made of gallium nitride or aluminum gallium nitride, for example. The fourth layer 54 is made of aluminum gallium nitride, for example. The first layer 51, the second layer 52, the third layer 53, and the fourth layer 54 may contain In.

The fourth layer 54 is larger in thickness than the third layer 53. The thickness of the fourth layer 54 can be set, for example, to 60 nm to 100 nm. The Al composition ratio of the fourth layer 54 is higher than the Al composition ratio of the first layer 51, and lower than the Al composition ratio of the semiconductor layer of the electron blocking layer 40 in contact with the fourth layer 54 (the second AlGaN layer). This can facilitate the supply of holes from the p-electrode 70 side to the active layer 30. The Al composition ratio of the fourth layer 54 is preferably set, for example, in a range of 50% to 70%, more preferably 60% to 70%.

An n-electrode 60 is disposed on the n-contact layer 22 and electrically connected to the n-side layer 20. An p-electrode 70 is disposed on the third layer 53 and electrically connected to the p-side layer 50.

For an n-electrode 60, for example, metals, such as Ag, Al, Ni, Au, Rh, Ti, Pt, Mo, Ta, W, and Ru, or alloys having these metals as main components can be used. The n-electrode 60 can be, for example, a multilayer structure including, successively from the n-contact layer 22 side, a Ti layer, an Al alloy layer, a Ta layer, and an Ru layer.

For a p-electrode 70, for example, a similar metal to that for the n-electrode 60 described above can be used. In the case in which the p-electrode 70 has the function of reflecting the light approaching the p-electrode 70 towards the n-side layer 20, the metal layer of the p-electrode 70 provided in contact with the third layer 53 is preferably a metal layer having a high reflectance with respect to the light from the active layer 30. For example, a metal layer having a reflectance of 70% or higher, preferably 80% or higher with respect to the light from the active layer 30 is preferably used. For such a metal layer, for example, an Rh layer or Ru layer is preferably used. The p-electrode 70 can be a multilayer structure that includes an Rh layer, an Au layer, an Ni layer, and a Ti layer, for example, or a multilayer structure that includes an Ru layer, an Au layer, an Ni layer, and a Ti layer.

When a forward voltage is applied across the n-electrode 60 and the p-electrode 70, a forward voltage applies across the p-side layer 50 and the n-side layer 20, supplying holes and electrons to the active layer 30 to thereby allow the active layer 30 to emit light.

Figure 3:
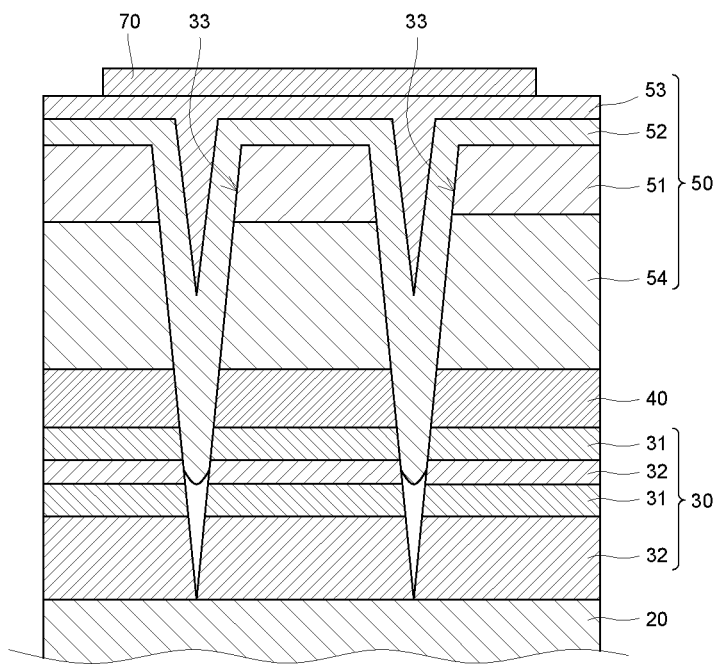
FIG. 3 is a schematic cross-sectional view showing the constituents of a light emitting element in a variation of the embodiment of the present invention.

In this embodiment, as shown in FIG. 2, the second layer 52 is in contact with the lateral faces of two well layers 31, but is not limited to this. FIG. 3 is a schematic cross-sectional view of a variation of this embodiment. As shown in FIG. 3, in the case in which an active layer 30 includes a plurality of well layers 31, the second layer 52 can simply be in contact with at least the lateral faces of the well layer 31 positioned closest to the p-side layer 50 among all well layers 31. As shown in FIG. 3, the lateral faces of the well layer 31 positioned on the n-side layer 20 side among the well layers 31 are exposed from the second layer 52. The well layer 31 positioned closest to the p-side layer 50 among the well layers 31 tends to emit light more intensely than the other well layers 31. Accordingly, disposing the second layer 52 to be in contact with the lateral faces of at least the well layer 31 positioned closest to the p-side layer 50 among the well layers 31 can efficiently achieve the effect of increasing the light extraction efficiency described above.

A method of manufacturing a light emitting element according to this embodiment will be explained below with reference to FIG. 4 to FIG. 10.

A method of manufacturing a light emitting element according to this embodiment includes a step of forming an n-side layer 20 made of a nitride semiconductor layer, a step of forming an active layer 30 on the n-side layer 20, a step of forming a p-side layer 50 on the active layer 30, a step of forming an n-electrode 60 electrically connected to the n-side layer 20, and a step of forming a p-electrode 70 electrically connected to the p-side layer 50. The step of forming a p-side layer 50 includes a step of forming a first layer 51 on the active layer 30, a step of forming a second layer 52 in contact with the upper face of the first layer 51 and the lateral faces of the well layer 31, and a step of forming a third layer 53 on the second layer 52.

Figure 4:
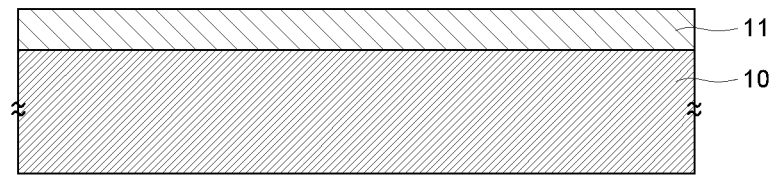
FIG. 4 is a schematic cross-sectional view explaining a method of manufacturing a light emitting element according to one embodiment of the present invention.

First, as shown in FIG. 4, a step of forming a buffer layer 11 made of AlN on C-plane of a substrate 10 made of sapphire, for example, is performed. The buffer layer 11 is formed by metal-organic chemical vapor deposition (MOCVD), for example. Each of the semiconductor layers described below can be epitaxially grown by MOCVD, for example.

Figure 5:
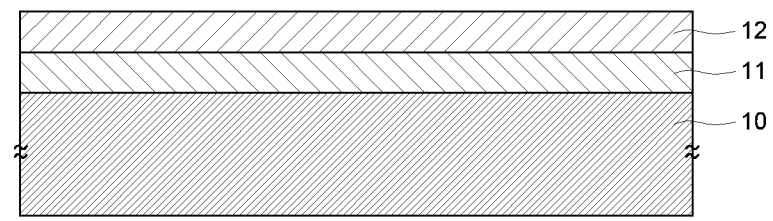
FIG. 5 is a schematic cross-sectional view explaining the method of manufacturing a light emitting element according to the embodiment of the present invention.

Next, as shown in FIG. 5, a step of forming a superlattice layer 12 on the buffer layer 11 is performed. The superlattice layer 12 is formed by alternately growing first semiconductor layers and second semiconductor layers having a different lattice constant from that of the first semiconductor layers. The first semiconductor layers are formed by growing AlN layers, for example, by using trimethyl aluminum (TMA) gas and ammonia gas as source gases, and primarily hydrogen ($H_2$) gas as a carrier gas. The second semiconductor layers are formed by growing AlGaN layers, for example, by using TMA gas, trimethyl gallium (TMG) gas, and ammonia gas as source gases, and primarily hydrogen ($H_2$) gas as a carrier gas. Each layer of the superlattice layer 12 can be formed by setting the temperature, for example, at 1000° C. to 1250° C.

Figure 6:
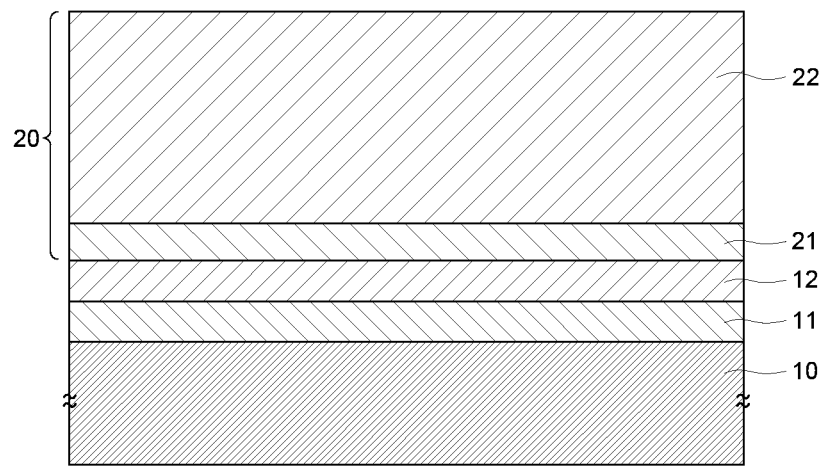
FIG. 6 is a schematic cross-sectional view explaining the method of manufacturing a light emitting element according to the embodiment of the present invention.

Then as shown in FIG. 6, a step of forming on the superlattice layer 12 an n-side layer 20 that includes an underlayer 21 and an n-contact layer 22 is performed. The underlayer 21 is formed by growing an AlGaN layer, for example, by using TMA gas, TMG gas, and ammonium gas as source gases, and primarily hydrogen gas as a carrier gas. The n-contact layer 22 is formed by growing an AlGaN layer containing an n-type impurity, for example, by using TMA gas, TMG gas, and ammonium gas as source gases, as well as monosilane ($SiH_4$) gas as an n-type impurity gas, and primarily hydrogen gas as a carrier gas. Each layer of the n-side layer 20 can be formed by setting the temperature, for example, at 1000° C. to 1250° C.

Figure 7:
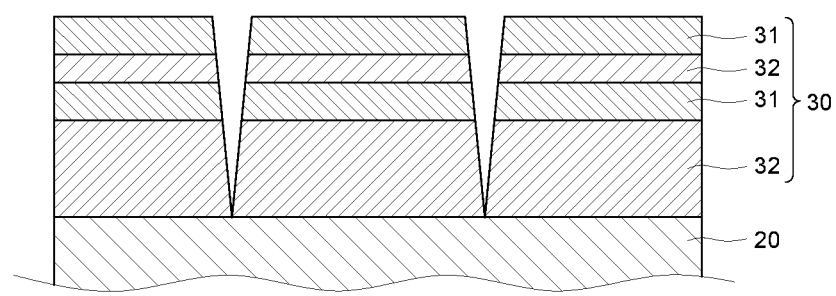
FIG. 7 is a schematic cross-sectional view explaining the method of manufacturing a light emitting element according to the embodiment of the present invention.

Next, as shown in FIG. 7, a step of forming on the n-side layer 20 an active layer 30 that includes well layers 31 and barrier layers 32 is performed. The well layers 31 are formed by growing AlGaN layers, for example, by using TMA gas, TMG gas, and ammonium gas as source gases, and primarily nitrogen gas as a carrier gas. The barrier layers 32 are formed by growing AlGaN layers, for example, by using TMA gas, TMG gas, and ammonium gas as source gases, and primarily nitrogen gas as a carrier gas. An active layer 30 including a plurality of well layers 31 and a plurality of barrier layers 32 is formed by alternately growing the well layers 31 and the barrier layer 31, for example. In the step of forming a barrier layer 32, $SiH_4$ gas can be used as an n-type impurity gas to allow the layer to contain an n-type impurity. Each layer of the active layer 30 can be formed by setting the temperature, for example, at 850° C. to 1050° C.

As shown in FIG. 7, a step of forming an active layer creates an active layer 30 that has holes defined by the lateral faces of multiple well layers 31 and the lateral faces of multiple barrier layers 32. In the step of forming an active layer, a carrier gas practically free of hydrogen gas is preferably used. This makes it easier to keep the holes unfilled to thereby form an active layer 30 in the state of exposing the lateral faces of the well layers 31.

Figure 8:
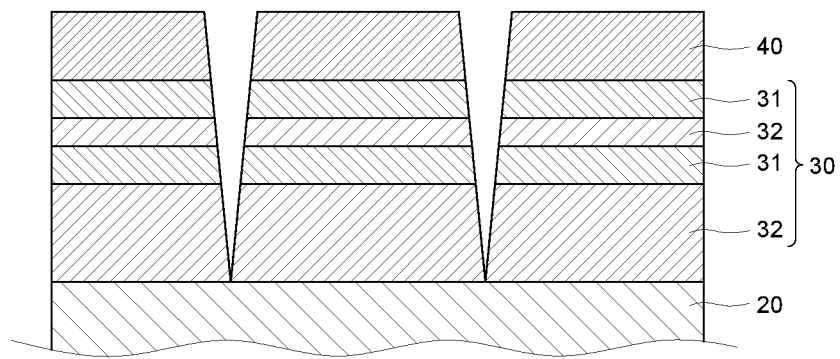
FIG. 8 is a schematic cross-sectional view explaining the method of manufacturing a light emitting element according to the embodiment of the present invention.

Then as shown in FIG. 8, a step of forming an electron blocking layer 40 on the active layer 30 is performed. The electron blocking layer 40 is formed to include an AlN layer, a first AlGaN layer, and a second AlGaN layer. The AlN layer of the electron blocking layer 40 is formed by using, for example, TMA gas and ammonia gas as source gases, and primarily nitrogen gas as a carrier gas. The first AlGaN layer of the electron blocking layer 40 is formed by using, for example, TMA gas, TMG gas, and ammonia gas as source gases, and nitrogen gas as a carrier gas. The second AlGaN layer of the electron blocking layer 40 is formed by using, for example, TMA gas, TMG gas, and ammonia gas as source gases, and primarily nitrogen gas as a carrier gas. For example, in the step of forming a second AlGaN layer, the flow ratio of the TMA gas, which is an Al source gas, is set higher than the flow ratio of the TMA gas in the step of forming a first AlGaN layer. In this manner, the second AlGaN layer having a higher Al composition ratio than that of the first AlGaN layer can be formed. Each layer of the electron blocking layer 40 can be formed by setting the temperature, for example, at 750° C. to 950° C.

As shown in FIG. 8, the electron blocking layer 40 is formed on the active layer 30 where the holes are absent so as not to fill the holes in the active layer 30. In the step of forming an electron blocking layer 40, it is preferable to use a carrier gas that contains practically no hydrogen gas. This makes it difficult to fill the holes in the active layer 30, thereby easily forming the electron blocking layer 40 while exposing the lateral faces of the well layers 31 from the electron blocking layer 40.

Figure 9:
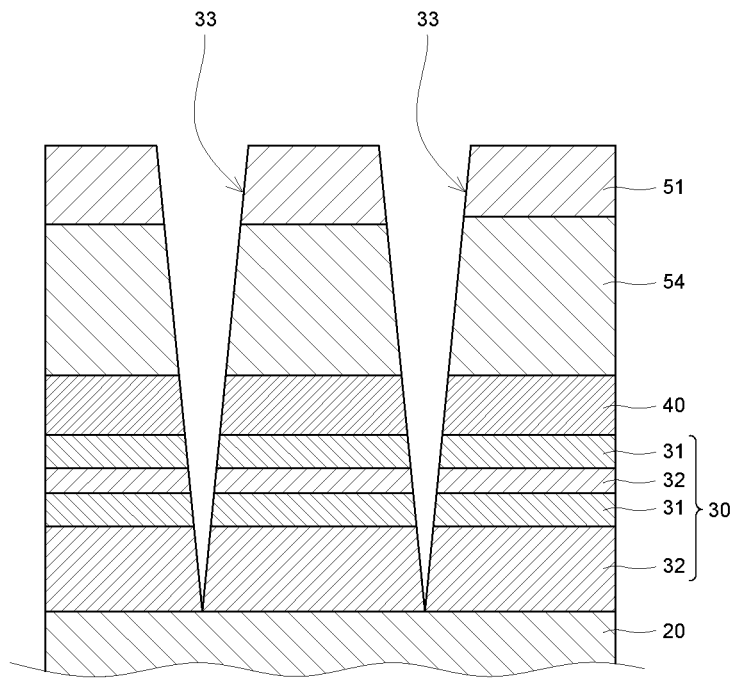
FIG. 9 is a schematic cross-sectional view explaining the method of manufacturing a light emitting element according to the embodiment of the present invention.
Figure 10:
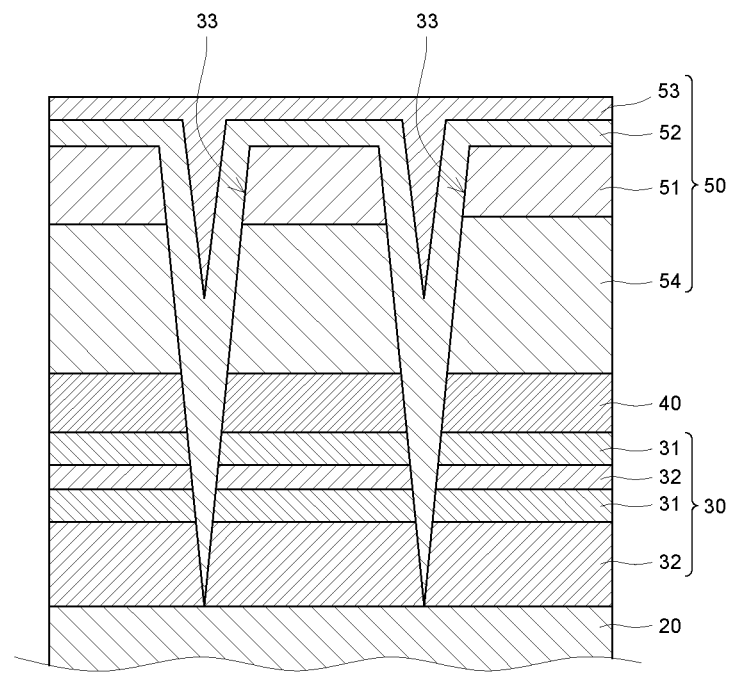
FIG. 10 is a schematic cross-sectional view explaining the method of manufacturing a light emitting element according to the embodiment of the present invention.

Next, as shown in FIG. 9 and FIG. 10, a step of forming a p-side layer 50 on the electron blocking layer 40 is performed. The p-side layer 50 is formed by growing successively from the active layer 30 side a fourth layer 54, a first layer 51, a second layer 52, and a third layer 53. The first layer 51, the second layer 52, the third layer 53, and the fourth layer 54 are each formed by growing an AlGaN layer containing Mg as a p-type impurity by using, for example, TMA gas, TMG gas, and ammonia gas as source gases, and cyclopentadienyl magnesium (Cp$_2$Mg) gas as a p-type impurity gas. Each layer of the p-side layer 50 can be formed by setting the temperature, for example, at 750° C. to 950° C.

As shown in FIG. 9, the fourth layer 54 is formed on the electron blocking layer 40 that is not provided in the holes of the active layer 30 so as to be absent in the holes in the active layer 30. In the step of forming a fourth layer 54, a practically hydrogen-free carrier gas is preferably used. This makes it difficult to fill the holes in the active layer 30, thereby easily forming the fourth layer 54 while exposing the lateral faces of the well layers 31 from the fourth layer 54.

As shown in FIG. 9, the first layer 51 is formed on the fourth layer 54 that is not provided in the holes of the active layer 30 so as to be absent in the holes in the active layer 30. Similar to the step of forming a fourth layer 54, in the step of forming a first layer 51, a practically hydrogen-free carrier gas is preferably used. This makes it difficult to fill the holes in the active layer 30, thereby easily forming the first layer 51 while exposing the lateral faces of the well layers 31 from the first layer 51.

As shown in FIG. 10, in the step of forming a second layer 52, the second layer 52 is formed so as to be in contact with the lateral faces of the well layers 31, thereby filling the V pits 33. The growth rate in forming the second layer 52 is preferably set lower than the growth rate in forming the first layer 51. For example, the growth rate can be reduced by using a lower flow ratio of ammonia gas that is a source gas used in forming the second layer 52 than the flow ratio of ammonia gas that is a source gas used in forming the first layer 51. This makes it easier for the second layer 52 to fill the V pits 33, thereby facilitating the formation of the second layer 52 in contact with the lateral faces of the well layers 31. This can also bring the surface condition of the upper face of the second layer 52 on which a third layer 53 will be formed close to being flat, thereby improving the crystalline quality of the third layer 53.

The growth rate in forming the third layer 53 is preferably set lower than the growth rate in forming the first layer 51. For example, the growth rate can be reduced by using a lower flow ratio of ammonia gas that is a source gas used in forming the third layer 53 than the flow ratio of ammonia gas that is a source gas used in forming the first layer 51. This can bring the surface condition of the upper face of the third layer 53 closer to being flat than the upper face of the second layer 52. This, as a result, can facilitate the electrical connection between the third layer 53 and the p-electrode 70 to thereby reduce the forward voltage Vf.

The p-type impurity gas flow ratio in forming the second layer 52 is preferably set higher than the p-type impurity gas flow ratio in the step of forming a first layer 51. This allows the second layer 52 to fill the V pits 33 more easily such that the second layer 52 can be formed in contact with the lateral faces of the well layers 31.

The p-type impurity gas flow ratio in forming the third layer 53 is preferably set higher than the p-type impurity gas flow ratio in the step of forming a first layer 51. This can bring the surface condition of the upper face of the third layer 53 closer to being flat than the upper face of the second layer 52.

Subsequent to forming each semiconductor layer, a heat treatment is conducted in a nitrogen atmosphere in the reaction chamber at a temperature ranging from 400° C. to 550° C., for example.

Subsequent to the heat treatment, a portion of the p-side layer 50, a portion of the electron blocking layer 40, and a portion of the active layer 30 are removed to expose a portion of the n-contact layer 22.

Then as shown in FIG. 1, an n-electrode 60 is formed on the exposed n-contact layer 22, and a p-electrode 70 is formed on the third layer 53 of the p-side layer 50.

By following the steps described above, a light emitting element of this embodiment can be produced.

Light emitting elements in Examples 1, 2, and Reference Example will be explained below.

Example 1

As the substrate 10, a sapphire substrate having C-plane as a principal plane was used. On the substrate 10, a buffer layer 11 made of AlN was formed to a thickness of 2 µm.

The temperature was then set at 1175° C., and an Al$_{0.60}$Ga$_{0.40}$N layer was formed on the buffer layer 11 to a thickness of about 21 nm by using TMA gas, TMG gas, and ammonia gas as source gases. This was followed by forming an AlN layer at 1175° C. to a thickness of about 10 nm by using TMA gas and ammonia gas as source gases. A superlattice layer 12 was formed by stacking 30 pairs of such AlGaN and AlN layers.

Then at 1175° C., an underlayer 21 was formed on the superlattice layer 12 by growing Al$_{0.60}$Ga$_{0.40}$N to a thickness of about 0.5 µm by using TMA gas, TMG gas, and ammonia gas as source gases. This was followed by forming an n-contact layer 22 at 1175° C. by growing Al$_{0.60}$Ga$_{0.40}$N containing an n-type impurity to a thickness of about 2.2 µm by using TMA gas, TMG gas, ammonia gas, and SiH$_4$ gas as source gases. An n-side layer 20 including such an underlayer 21 and n-contact layer 22 was formed. The n-type impurity concentration of the n-contact layer 22 was about 9.5×10$^{18}$ cm$^3$.

Next, the temperature was set at 950° C. and a barrier layer 32 was formed on the n-side layer 20 by growing Al$_{0.52}$Ga$_{0.48}$N containing an n-type impurity to a thickness of about 50 nm by using TMA gas, TMG gas, ammonia gas, and SiH$_4$ gas as source gases. This was followed by forming a well layer 31 at 950° C. by growing Al$_{0.42}$Ga$_{0.58}$N to a thickness of about 4.4 nm by using TMA gas, TMG gas, and ammonia gas as source gases. This was followed by forming a barrier layer 32 at 950° C. by growing Al$_{0.52}$Ga$_{0.48}$N containing an n-type impurity to a thickness of about 2.5 nm by using TMA gas, TMG gas, ammonia gas, and SiH$_4$ gas as source gases. Then a well layer 31 was formed at 950° C. by growing Al$_{0.42}$Ga$_{0.58}$N to a thickness of about 4.4 nm by using TMA gas, TMG gas, and ammonia gas as source gases. In this manner, an active layer 30, which included two well layers 31 and two barrier layers 32, was formed.

Next, the temperature was set at 870° C., and an AlN layer was formed on the active layer 30 to a thickness of about 1 nm by using TMA gas and ammonia gas as source gases. This was followed by forming a first AlGaN layer at 870° C. by growing Al$_{0.55}$Ga$_{0.45}$N to a thickness of about 1 nm by using TMA gas, TMG gas, and ammonia gas as source gases. This was followed by forming a second AlGaN layer at 870° C. by growing Al$_{0.78}$Ga$_{0.22}$N to a thickness of about 4 nm by using TMA gas, TMG gas, and ammonia gas as source gases. An electron blocking layer 40 that included such an AlN layer and two AlGaN layers was formed.

Then the temperature was set at 870° C., and a fourth layer 54 was formed on the electron blocking layer 40 by growing Al$_{0.63}$Ga$_{0.37}$N containing a p-type impurity to a thickness of about 78 nm by using TMA gas, TMG gas, ammonia gas, and Cp$_2$Mg gas as source gases. This was followed by forming a first layer 51 at 870° C. by growing $Al_{0.53}Ga_{0.47}N$ containing a p-type impurity to a thickness of about 30 nm by using TMA gas, TMG gas, ammonia gas, and $Cp_2Mg$ gas as source gases. Then the temperature was set at 900° C., and a second layer 52 was formed by growing $Al_{0.40}Ga_{0.60}N$ containing a p-type impurity to a thickness of about 10 nm by using TMA gas, TMG gas, ammonia gas, and $Cp_2Mg$ gas as source gases. This was followed by forming a third layer 53 at 900° C. by growing GaN containing a p-type impurity to a thickness of about 10 nm by using TMG gas, ammonia gas, and $Cp_2Mg$ gas as source gases. A p-side layer 50 that included such a first layer 51, second layer 52, third layer 53, and fourth layer 54 was formed. The ammonia gas flow ratio in the source gases in forming the second layer 52 and the third layer 53 was set lower than the ammonia gas flow ratio in forming the first layer 51. Furthermore, the $Cp_2Mg$ gas flow ratio in the source gases in forming the second layer 52 and the third layer 53 was set higher than the $Cp_2Mg$ gas flow ratio in the source gases in forming the first layer 51.

Subsequent to forming each semiconductor layer, a heat treatment was conducted in the reaction chamber. The heat treatment was performed in a nitrogen atmosphere at the temperature of about 475° C.

Subsequent to the heat treatment, a portion of the p-side layer 50 and a portion of the active layer 30 were removed to expose a portion of the n-side contact layer 22 from the p-side layer 50 and the active layer 30.

Then an n-electrode 60 was formed on the n-contact layer 22, and a p-electrode 70 was formed on the third layer 53 of the p-side layer 50. For the n-electrode 60, a multilayer structure in which a Ti layer, an AlSi layer, a Ta layer, an Ru layer, and a Ti layer were successively stacked from the n-contact layer 22 side was used. For the p-electrode 70, a multilayer structure in which a Ti layer, an Ru layer, and a Ti layer were successively stacked from the third layer 53 side was used.

Subsequently, the substrate 10 was divided into multiple light emitting elements. The outline of the substrate 10 of each light emitting element after being divided was a square each side being 1000 μm in length in a plan view. The substrate 10 of each light emitting element was 700 μm in thickness.

With respect to the light emitting element in Example 1 produced as described above, the forward voltage Vf was 5.86 V and the output Po was 182 mW. The forward voltage Vf and the output Po of each of Examples 1, 2 and Reference Example are the values obtained when a 350 mA current was applied.

Example 2

The light emitting element in Example 2 was produced in a similar manner as in Example 1 except for using a different structure for the first layer 51.

For the light emitting element in Example 2, the first layer 51 was formed by growing an $Al_{0.53}Ga_{0.47}N$ layer containing a p-type impurity to a thickness of about 27 nm and a composition gradient layer containing a p-type impurity to a thickness of about 3 nm. The composition gradient layer of the first layer 51 was formed to be located on the second layer 52 side. The composition gradient layer was formed such that the Al composition ratio decreased from the active layer 30 side to the second layer 52 side by reducing the TMA gas flow ratio. The composition gradient layer was formed such that the Al composition ratio decreased from about 53% to about 0% from the active layer 30 side to the second layer 52 side.

With respect to the light emitting element in Example 2 produced as described above, the forward voltage Vf was 5.13 V and the output Po was 161 mW.

Reference Example

The light emitting element in Reference Example was produced in a similar manner as in Example 1 except for using a partially different structure for both the p-side layer 50 and the p-electrode 70.

For the light emitting element in Reference Example, the second layer 52 was formed by setting the temperature at 870° C. and growing GaN containing a p-type impurity to a thickness of about 350 nm by using TMG gas, ammonia gas, and $Cp_2Mg$ gas as source gases. Furthermore, the third layer 53 was formed at 870° C. by growing GaN containing a p-type impurity to a thickness of about 20 nm by using TMG gas, ammonia gas, and $Cp_2Mg$ gas as source gases. For the p-electrode 70, a multilayer structure in which a Ti layer, an Rh layer, and a Ti layer were successively stacked from the third layer 53 side was used.

With respect to the light emitting element in Reference Example produced as described above, the forward voltage Vf was 7.08 V and the output Po was 103 mW.

As is understood from the above, the light emitting elements in Examples 1 and 2 were able to achieve a higher output Po and a lower forward voltage Vf than the light emitting element in Reference Example. This is believed to be because the V pits 33 filled with the second layer 52 facilitated the light extraction from the lateral faces of the well layers 31. The light emitting element in Example 2 had a 21 mW lower output Po, but a 0.73 V lower forward voltage Vf than the light emitting element in Example 1. This is believed to be because the portion of the first layer 51 that was a composition gradient layer with a lower Al composition ratio reduced the forward voltage Vf, but the increased lower Al composition ratio portion of the first layer 51 increased the light absorption by the first layer 51 to reduce the output Po.

In the foregoing, certain embodiments of the present invention have been explained with reference to specific examples. The present invention, however, is not limited to these specific examples. All forms implementable by a person skilled in the art by suitably making design changes based on any of the embodiments of the present invention described above also fall within the scope of the present invention so long as they encompass the subject matter of the present invention. Furthermore, various modifications and alterations within the spirit of the present invention that could have been made by a person skilled in the art also fall within the scope of the present invention.

The present embodiment includes the following formats.

Aspect 1

A light emitting element comprising:
- a semiconductor structure comprising an n-side layer, a p-side layer, and an active layer to emit ultraviolet light positioned between the n-side layer and the p-side layer, each being made of a nitride semiconductor;
- an n-electrode electrically connected to the n-side layer; and
- a p-electrode electrically connected to the p-side layer, wherein
- the active layer comprises a well layer containing Al, a barrier layer containing Al, and holes defined by the lateral faces of the well layer and the lateral faces of the barrier layer, the p-side layer comprises a first layer containing Al, a second layer containing Al disposed on the first layer and in contact with the lateral faces of the well layer, and a third layer disposed on the second layer, wherein:
a thickness of the third layer is less than a thickness of the first layer,
the second layer has a 10% Al composition ratio difference or less from the Al composition ratio of the well layer,
An Al composition ratio of the third layer is less than an Al composition ratio of the second layer or the third layer contain no Al, and
the p-electrode is disposed on the third layer.

Aspect 2

The light emitting element according to Aspect 1 wherein the thickness of the third layer is less than the thickness of the second layer.

Aspect 3

The light emitting element according to Aspect 1 or 2 wherein:
the first layer, the second layer, and the third layer contain a p-type impurity,
each of a p-type impurity concentration of the second layer and a p-type impurity concentration of the third layer is less than a p-type impurity concentration of the first layer.

Aspect 4

The light emitting element according to Aspect 3, wherein the p-type impurity concentration of the third layer is higher than the p-type impurity concentration of the second layer.

Aspect 5

The light emitting element according to Aspect 3 or 4, wherein the p-type impurity concentration of the second layer is in a range of $1 \times 10^{19}$ cm$^3$ to $1 \times 10^{21}$ cm$^3$.

Aspect 6

The light emitting element according to any of Aspects 1 to 5, wherein an Al composition ratio the first layer is higher than the Al composition ratio of the second layer.

Aspect 7

The light emitting element according to any of Aspects 1 to 6, wherein the Al composition ratio of the second layer is higher the Al composition ratio of the well layer.

Aspect 8

The light emitting element according to any of Aspects 1 to 7, wherein the Al composition ratio of the well layer is 10% or higher.

Aspect 9

The light emitting element according to any of Aspects 1 to 8, wherein the thickness of the second layer is in a range of 3 nm to 20 nm.

Aspect 10

A method of manufacturing a light emitting element comprising:
forming an n-side layer made of a nitride semiconductor;
forming on the n-side layer an active layer to emit ultraviolet light comprising a well layer containing Al and a barrier layer containing Al, each being made of a nitride semiconductor, and holes defined by the lateral faces of the well layer and the lateral faces of the barrier layer;
forming on the active layer a p-side layer having a first layer containing Al, a second layer containing Al, the Al composition ratio difference from the Al composition ratio of the well layer being 10% or less, and a thickness of the third layer less than a thickness of the first layer and having a lower Al composition ratio than the Al composition ratio of the second layer or containing no Al, each being made of a nitride semiconductor;
forming an n-electrode electrically connected to the n-side layer; and
forming a p-electrode electrically connected to the third layer of the p-side layer, wherein:
the step of forming a p-side layer comprises:
forming the first layer on the active layer,
forming the second layer on the first layer and in contact with the lateral faces of the well layer, and
forming the third layer on the second layer.

Aspect 12

The method according to Aspect 11, wherein the second layer is formed at a lower growth rate than the growth rate for forming the first layer.

Aspect 13

The method according to Aspect 11 or 12, wherein the third layer is formed at a lower growth rate than the growth rate for forming the first layer.

Aspect 14

The method according to any of Aspects 11 to 13, wherein:
in the step of forming a first layer, the first layer is formed containing a p-type impurity by using a p-type impurity gas, and
in the step of forming a second layer, the second layer is formed containing a p-type impurity by using a p-type impurity gas,
the p-type impurity gas flow ratio in the step of forming a second layer is higher than the p-type impurity gas flow ratio in the step of forming a first layer.

Aspect 15

The method according to any of Aspects 11 to 14, wherein:
in the step of forming a first layer, the first layer is formed containing a p-type impurity by using a p-type impurity gas, and
in the step of forming a third layer, the third layer is formed containing a p-type impurity by using a p-type impurity gas,
the p-type impurity gas flow ratio in the step of forming a third layer is higher than the p-type impurity gas flow ratio in the step of forming a first layer.

What is claimed is:

1. A light emitting element comprising:
a semiconductor structure comprising an n-side layer, a p-side layer, and an active layer configured to emit ultraviolet light positioned between the n-side layer and the p-side layer, each being made of a nitride semiconductor;
an n-electrode electrically connected to the n-side layer; and
a p-electrode electrically connected to the p-side layer, wherein:
the active layer comprises a well layer containing Al, a barrier layer containing Al, and holes defined by lateral faces of the well layer and lateral faces of the barrier layer,
the p-side layer comprises a first layer containing Al, a second layer containing Al disposed on the first layer and in contact with the lateral faces of the well layer, and a third layer disposed on the second layer,
a thickness of the third layer is less than a thickness of the first layer,
an Al composition ratio of the second layer differs from an Al composition ratio of the well layer by 10% or less, an Al composition ratio of the third layer is less than an Al composition ratio of the second layer, or the third layer contains no Al, and the p-electrode is disposed on the third layer.

2. The light emitting element according to claim 1, wherein the thickness of the third layer is less than a thickness of the second layer.

3. The light emitting element according to claim 2, wherein an Al composition ratio of the first layer is higher than the Al composition ratio of the second layer.

4. The light emitting element according to claim 2, wherein the Al composition ratio of the second layer is higher the Al composition ratio of the well layer.

5. The light emitting element according to claim 2, wherein the Al composition ratio of the well layer is 10% or higher.

6. The light emitting element according to claim 2, wherein the thickness of the second layer is in a range of 3 nm to 20 nm.

7. The light emitting element according to claim 1, wherein:

the first layer, the second layer, and the third layer contain a p-type impurity, and each of a p-type impurity concentration of the second layer and a p-type impurity concentration of the third layer is less than a p-type impurity concentration of the first layer.

8. The light emitting element according to claim 7, wherein the p-type impurity concentration of the third layer is higher than the p-type impurity concentration of the second layer.

9. The light emitting element according to claim 7, wherein the p-type impurity concentration of the second layer is in a range of $1\times10^{19}$ cm$^3$ to $1\times10^{21}$ cm$^3$.

10. The light emitting element according to claim 1, wherein an Al composition ratio of the first layer is higher than the Al composition ratio of the second layer.

11. The light emitting element according to claim 1, wherein the Al composition ratio of the second layer is higher the Al composition ratio of the well layer.

12. The light emitting element according to claim 1, wherein the Al composition ratio of the well layer is 10% or higher.

13. The light emitting element according to claim 1, wherein a thickness of the second layer is in a range of 3 nm to 20 nm.

14. The light emitting element according to claim 1, wherein:

the first layer and the second layer are made of aluminum gallium nitride, and the third layer is made of gallium nitride.

15. A method of manufacturing a light emitting element, the method comprising:

forming an n-side layer made of a nitride semiconductor;

forming, on the n-side layer, an active layer configured to emit ultraviolet light and comprising a well layer containing Al and a barrier layer containing Al, each being made of a nitride semiconductor, and holes defined by lateral faces of the well layer and lateral faces of the barrier layer;

forming, on the active layer, a p-side layer comprising a first layer containing Al, a second layer containing Al, and a third layer, each being made of a nitride semiconductor, wherein an Al composition ratio of the second layer differs from an Al composition ratio of the well layer by 10% or less, wherein a thickness of the third layer is less than a thickness of the first layer, wherein an Al composition ratio of the third layer is less than an Al composition ratio of the second layer, or the third layer contains no Al, and wherein the step of forming the p-side layer comprises:

forming the first layer on the active layer, forming the second layer on the first layer and in contact with the lateral faces of the well layer, and forming the third layer on the second layer;

forming an n-electrode electrically connected to the n-side layer; and forming a p-electrode electrically connected to the third layer of the p-side layer.

16. The method according to claim 15, wherein a growth rate at which the second layer is formed is lower than a growth rate at which the first layer is formed.

17. The method according to claim 16, wherein a growth rate at which the third layer is formed is lower than a growth rate at which the first layer is formed.

18. The method according to claim 16, wherein:

in the step of forming a first layer, the first layer is formed to contain a p-type impurity by using a p-type impurity gas, and in the step of forming a second layer, the second layer is formed to contain a p-type impurity by using a p-type impurity gas, a p-type impurity gas flow ratio in the step of forming a second layer is higher than a p-type impurity gas flow ratio in the step of forming a first layer.

19. The method according to claim 16, wherein:

in the step of forming a first layer, the first layer is formed to contain a p-type impurity by using a p-type impurity gas, and in the step of forming a third layer, the third layer is formed to contain a p-type impurity by using a p-type impurity gas, a p-type impurity gas flow ratio in the step of forming a third layer is higher than a p-type impurity gas flow ratio in the step of forming a first layer.

20. The method according to claim 15, wherein:

in the step of forming a first layer, the first layer is formed to contain a p-type impurity by using a p-type impurity gas, and in the step of forming a second layer, the second layer is formed to contain a p-type impurity by using a p-type impurity gas, a p-type impurity gas flow ratio in the step of forming a second layer is higher than a p-type impurity gas flow ratio in the step of forming a first layer.

21. The method according to claim 15, wherein:

in the step of forming a first layer, the first layer is formed to contain a p-type impurity by using a p-type impurity gas, and in the step of forming a third layer, the third layer is formed to contain a p-type impurity by using a p-type impurity gas, a p-type impurity gas flow ratio in the step of forming a third layer is higher than a p-type impurity gas flow ratio in the step of forming a first layer.

* * * * *